United States Patent [19]
Whitfield

[11] Patent Number: 5,764,097
[45] Date of Patent: Jun. 9, 1998

[54] AUTOMATICALLY BIASED VOLTAGE LEVEL CONVERTER

[75] Inventor: Colin Whitfield, Bristol, United Kingdom

[73] Assignee: SGS-Thomson Microelectronics Limited, Bristol, United Kingdom

[21] Appl. No.: 555,988

[22] Filed: Nov. 15, 1995

[30] Foreign Application Priority Data

Nov. 15, 1994 [GB] United Kingdom ............... 9423051

[51] Int. Cl.$^6$ ................................................ H03K 17/74
[52] U.S. Cl. .......................... 327/540; 327/530; 327/504; 365/189.09; 365/185.23
[58] Field of Search ................ 327/52, 54, 333, 327/545, 546, 321, 320, 325, 530, 534, 535, 538, 540, 541, 543, 504; 365/185.23, 189.09; 307/44, 80, 85, 86, 87

[56] References Cited

U.S. PATENT DOCUMENTS

| | | | |
|---|---|---|---|
| 4,565,932 | 1/1986 | Kuo et al. | 365/185.23 |
| 4,737,936 | 4/1988 | Takeuchi | 365/185.23 |
| 4,893,275 | 1/1990 | Tanaka et al. | 365/189.09 |
| 4,952,795 | 8/1990 | Gauthier et al. | 327/325 |
| 5,003,511 | 3/1991 | Secol et al. | 327/537 |
| 5,162,676 | 11/1992 | Aoki et al. | 327/540 |
| 5,179,297 | 1/1993 | Hsueh et al. | 327/530 |
| 5,253,206 | 10/1993 | Tanaka et al. | 365/185.23 |
| 5,341,344 | 8/1994 | Maruyama | 365/185.23 |
| 5,350,951 | 9/1994 | Adachi | 365/185.23 |
| 5,394,028 | 2/1995 | Feddeler et al. | 327/546 |
| 5,412,257 | 5/1995 | Cordoba et al. | 327/536 |
| 5,457,414 | 10/1995 | Inglis et al. | 327/545 |
| 5,493,244 | 2/1996 | Pathak et al. | 327/333 |

FOREIGN PATENT DOCUMENTS

| | | | |
|---|---|---|---|
| 322022A1 | 6/1989 | European Pat. Off. | H04N 3/12 |
| 0 469 587 A2 | 2/1992 | European Pat. Off. | |
| 499110A3 | 8/1992 | European Pat. Off. | H03K 17/693 |
| 6-86458 | 3/1994 | Japan | 327/530 |
| 6-152383 | 5/1994 | Japan | H03K 19/00 |

Primary Examiner—Timothy P. Callahan
Assistant Examiner—Terry L. Englund
Attorney, Agent, or Firm—David V. Carlson; Seed and Berry LLP

[57] ABSTRACT

A voltage level converter having: an input bias terminal; connect to first, second and third voltage sources; first and second complementary output terminals; and an input control terminal wherein, said input bias terminal is connected to a third output terminal of an automatic bias stage, said bias stage having connections to said voltage sources for providing substantially said first low voltage to said third output terminal in the absence of said second high voltage and providing a third voltage that is greater than said first low voltage when said second high voltage is present, said third voltage being derived from said second high voltage.

25 Claims, 6 Drawing Sheets

AUTOMATICALLY BIASED VOLTAGE LEVEL CONVERTER

TECHNICAL FIELD

This invention concerns a method and apparatus for the biasing of a voltage level converter, which is sometimes referred to as a voltage level translator. The invention is intended for systems in which there are a plurality of positive supply voltages, and in particular, to EEPROM and FLASH EEPROM memory circuits.

BACKGROUND OF THE INVENTION

FIG. 1 illustrates a block diagram of a known voltage level converter 10 that comprises: a cross-coupled stage 12; a cascode stage 14; and a switching stage 16 for providing a high level control voltage, or voltages, to a memory circuit 17 such as an EEPROM or FLASH EEPROM memory circuit.

The cross-coupled stage 12 is connected to a high positive voltage source VPP and provides high voltage complementary output signals $OUT_H$ and $NOUT_H$ on the respective output terminals 18 and 20. The outputs 18 and 20, in this example, are coupled to the terminal switches of the memory cells (not illustrated) within the memory 17.

The inputs of the cascode stage 14 are connected to the outputs 18 and 20 of the cross-coupled stage 12. The cascode stage 14 provides low voltage complementary output signals $NOUT_L$ and $OUT_L$ on the respective terminals 22 and 24 and is biased on terminal 25 by a low positive voltage source VCC.

Two input terminals of the switching stage 16 are connected to the respective outputs 22 and 24 of the cascode stage 14. The switching stage 16 is controlled, via a third input terminal 26, by an input control signal VCTL and is connected to the low voltage source VCC and a negative, or reference, voltage source VSS; the voltage level of the input control signal VCTL is normally derived from the voltage source VCC. The connection to the voltage source VCC is made via terminal 27.

FIG. 2 illustrates a detailed circuit diagram of that of FIG. 1.

Referring to FIG. 2, the cross-coupled stage 12 comprises two cross-coupled p-channel MOS, or PMOS, transistors MP1 and MP2 whose sources are connected to the high voltage source VPP. The gate of transistor MP1 is connected to the drain 18 of transistor MP2 and the gate of transistor MP2 is connected to the drain 20 of transistor MP1.

The cascode stage 14 comprises two n-channel MOS, or NMOS, transistors MN1 and MN2 whose drains are respectively connected to the drains of transistors MP1 and MP2 and whose gates are connected to terminal 25 which in turn is connected to the voltage source VCC.

The switching stage 16 comprises two NMOS transistors MN3 and MN4 and a CMOS inverter INV1. The drains of transistors MN3 and MN4 are respectively connected to the sources of transistors MN1 and MN2. The control signal VCTL is connected to the gate of transistor MN3 and to the input of inverter INV1. The gate of transistor MN4 is connected to the output 28 of inverter INV1. The high-side of inverter INV1 is connected to terminal 27 which in turn is connected to the voltage source VCC whilst the low-side of inverter INV1 is connected to voltage source VSS.

The voltage level converter 10 can of course be implemented with appropriate, operatively connected, bipolar transistors or any suitable combination of MOS and bipolar transistors.

Since the operation of the circuit of FIG. 2 is symmetrical, only its operation with a steady state logic high, i.e. a voltage level of VCC, present on the gate 26 of transistor MN3 will be considered, as the inverse case is easily deduced by one skilled in the art.

Therefore, transistor MN3 is conducting whilst transistor MN4 is not conducting. Thus, transistor MN3 pulls the source 22 of transistor MN1 down to a voltage level of approximately VSS and transistor MN1 conducts, since the gate of transistor MN1, and indeed transistor MN2, is biased, via terminal 25, by the voltage source VCC. Transistor MN2 does not conduct since its source 24 is a high impedance terminal which is caused by the fact that transistor MN4 is not conducting. Transistor MN1 pulls the drain 20 of transistor MP1, and the gate of transistor MP2, down to a voltage level of approximately VSS, via transistor MN3. Since transistors MP1 and MP2 are cross-coupled, the action of pulling down one of the gates of either of these transistors causes the other to be pulled up, thus complementary output signals $OUT_H$ and $NOUT_H$ are provided. In this particular embodiment, the output signal $OUT_H$ is at a voltage level of approximately VPP, whilst the output signal $NOUT_H$ is at a voltage level of approximately VSS.

With the voltage source VCC supplying approximately 5 V, transistors MN1, MN2, MN3 and MN4 can have their respective aspect ratios, i.e. W/L ratios, dimensioned such that they are each capable of conducting sufficient current so as to ensure fast and reliable switching.

However, with a low voltage source VCC that supplies approximately 3V or less, the circuit, as illustrated in FIG. 2, at best exhibits poor switching characteristics and at worst fails to switch. Increasing the aspect ratios of transistors MN1, MN2, MN3 and MN4, relative to the aspect ratios of transistors MP1 and MP2, will improve the switching performance, i.e. speed and reliability, of the circuit but only at the expense of increased transistor size and power consumption. The primary cause of the circuits poor switching characteristics emanates from too low a voltage bias on the gates of transistors MN1 and MN2 of the cascode stage 14, when, as stated above, the voltage source VCC is approximately 3 V or less.

SUMMARY OF THE INVENTION

An object of the invention is to provide a voltage level converter, within the environment of the functional control system (i.e. the read, write, erase and verify control system) of a memory, that is workable with a low supply voltage (e.g. a supply voltage VCC of approximately 3 V, or less, as opposed to 5 V) during both the absence and presence of a high supply voltage (i.e. VPP=12 V); the high voltage being present during write, erase and verify function cycles.

In such an environment, the voltage level converter is required to change state only during the presence of the high voltage VPP, i.e. the voltage level converter is only required to switch during write, erase and verify function cycles. Therefore, the invention proposes to maintain the voltage level converter in a 'standby' mode using the low supply voltage, i.e. VCC=3 V, when the high voltage VPP is absent and, during the presence of VPP, to boost the voltage used to bias the voltage level converter, which is derived from VPP, to a value greater than the VCC value during write, erase and verify function cycles.

These objects are achieved according to one embodiment of the invention by a voltage level converter having: an input bias terminal; connections to a first low voltage source, a second high voltage source and a reference voltage source;

first and second output terminals that carry complementary high voltage output signals; and an input control terminal, said input bias terminal is connected to a third output terminal of an automatic bias stage that has connections to said voltage sources for providing substantially said first low voltage to said third output terminal in the absence of said second high voltage and providing a third voltage that is greater than said first low voltage when said second high voltage is present, said third voltage being derived from said second high voltage.

According to other embodiments of the invention, the automatic bias stage can be implemented by a plurality of unidirectional conductive circuits and/or current sources. One circuit or current source being operatively connected between each of said voltage sources and the output terminal of the bias stage. The unidirectional conductive circuits or current sources can be implemented using diodes for example. The diodes used can be any combination of operatively connected p-n, Schottky, MOS or zener diodes, and each of the unidirectional circuits and/or current sources can be implemented using one or more diodes.

In the case where the voltage magnitude of one of the positive voltage sources is low, for example 3V, it is advantageous to use an associated diode with a low forward voltage drop, i.e. a forward voltage drop of approximately 300 mV to 500 mV, such that the bias voltage is as near to the low supply voltage as possible. Schottky diodes exhibit low forward voltage drops, however, if the bias stage is to be implemented on a monolithic semiconductor substrate, an alternative to using a Schottky diode, is the MOS diode connected structure, which can be a 'natural' MOS device as opposed to a gate threshold voltage 'adjusted' device. A 'natural' MOS device is one where no impurities, or dopants, are introduced into the polysilicon gate, thus it typically exhibits a threshold voltage, i.e. a $V_{TH}$, of approximately 400 mV.

The alternative to a 'natural' MOS device is the $V_{TH}$ 'adjusted' device or devices. The 'adjusted' device(s) can have its gate doped with suitable impurities such that its gate threshold voltage is increased. Such an 'adjusted' device(s) is advantageous where the voltage magnitude of one of the positive voltage sources is high, for example 12 V, since a high voltage drop can be achieved by selection and/or design of the associated diode(s). Ideally, a single 'adjusted' device is preferred, however, the use of a plurality of 'adjusted' devices, or even a combination of 'adjusted' and 'natural' devices, is also possible. It may be necessary to use a diode, or diodes, with relatively high forward voltage drops, i.e. threshold voltages, such that the magnitude of the bias voltage is for example half of the voltage of the high voltage source, i.e. 12V/2=6 V.

Also, when MOS connected diodes are used, their threshold voltages can be 'adjusted' by adjusting their respective aspect ratios, i.e. the gate width over gate length (W/L) ratios. This technique of altering the threshold voltage can be used in conjunction, or as an alternative, to the 'natural' or 'doping' techniques described above.

According to other embodiments of the invention, the automatic bias stage can also comprise a controlled switching element for interrupting the flow of current between the output terminal of the bias stage and the negative voltage source. The controlled switching element can be placed either on the high side or the low side of the conduction circuit or current source and can be implemented using operatively connected and controlled MOS or bipolar transistors.

According to other embodiments of the invention, the voltage level converters can comprise: a cross-coupled stage, operatively connected to the second, i.e. high, voltage source, for providing one or more high voltage output signals; an operatively connected and biased, cascode stage, for buffering between the high voltage source and the negative, or reference, voltage source, said biasing being provided by the bias stage; and a switching stage, which is supplied by the first, i.e. low, voltage source that is operatively connected between the cascode stage and the negative voltage source and is operated in response to the low voltage input control signal. The cross-coupled stage can comprise first and second, operatively connected, PMOS transistors; the cascode stage can comprise first and second, operatively connected, NMOS transistors whose conduction is controlled by the bias voltage; the switching stage can comprises third and fourth, operatively connected, NMOS transistors and an inverting stage that has operative connections to the first and the reference voltage sources, an input terminal that is connected to the low voltage input control terminal and the gate terminal of the third NMOS transistor, and an output terminal that is connected to the gate terminal of the fourth NMOS transistor.

According to other embodiments of the invention, one or more bias stages and one or more voltage level converters can constitute part of one or more terminal switches in one or more memory cells or blocks of memory cells of a memory device or circuit. The memory device or circuit can be an EEPROM or a FLASH EEPROM type memory device or circuit that is operated within or by a computing system.

According to other embodiments of the invention, said one or more terminal switches can include: first and second voltage level converters; third and fourth PMOS transistors; circuitry for protecting the output terminal of the terminal switch, the first voltage level converter being supplied directly from all of said voltage sources, the second voltage level converter being supplied directly from the first voltage source and the reference voltage source and indirectly from the second voltage source via the third and fourth PMOS transistors, the input control terminals of the first and second voltage level converters being connected and controlled in unison, the input bias terminals of the first and second voltage level converters being connected and controlled in unison by the output of a bias stage, the third PMOS transistor having its source and substrate terminals connected to the second voltage source and its gate terminal connected to one of the output terminals of the first voltage level converter, the fourth PMOS transistor having its drain terminal connected to the drain terminal of the third PMOS transistor, the source and substrate terminals being connected to the output terminal of the terminal switch and its gate terminal being connected to one of the output terminals of the second voltage level converter which corresponds to that of the first voltage level converter, the circuitry for protecting the output terminal of the terminal switch having operative connections to all of said voltage sources, the drain terminals of the third and fourth PMOS transistors and the output terminal of the terminal switch; and/or a third voltage level converter that is supplied directly from all of said voltage sources that has input control and input bias terminals; a potential divider that has a sixth output terminal that provides an output voltage, said divider being supplied by the second voltage source and the reference voltage source, a fifth NMOS transistor that has its drain terminal connected to the output terminal of the terminal switch, its substrate terminal connected to the reference voltage source, its gate terminal connected to one of the output terminals of the third voltage level converter and its source terminal connected to the sixth output terminal.

According to other embodiments of the invention, the magnitude of the voltage, with respect to the reference voltage source, of the second voltage source is greater than voltage that of the first voltage source. The magnitude of the voltage of the second voltage source being approximately 12 V and that the magnitude of the voltage of the first voltage source being approximately 3 V.

According to another embodiment of the invention, the magnitude of the steady state bias voltage is as near to, but less, than approximately 3 V or is approximately 1 V, or more, greater than 3 V, but less than 12 V.

According to other embodiments of the invention, the bias stage, voltage level converters and/or EEPROM and/or FLASH EEPROM circuits are implemented on a monolithic semiconductor substrate integrated circuit or that the bias stage forms at least one element of an integrated circuit.

BRIEF DESCRIPTION OF THE DRAWINGS

The object, features and advantages, and others of the present invention will be understood more clearly from the following description and from the appended illustrations. These illustrations are given purely by way of example and in no way restrict the scope of the invention. Of these illustrations.

DETAILED DESCRIPTION

Figures 3, 4:
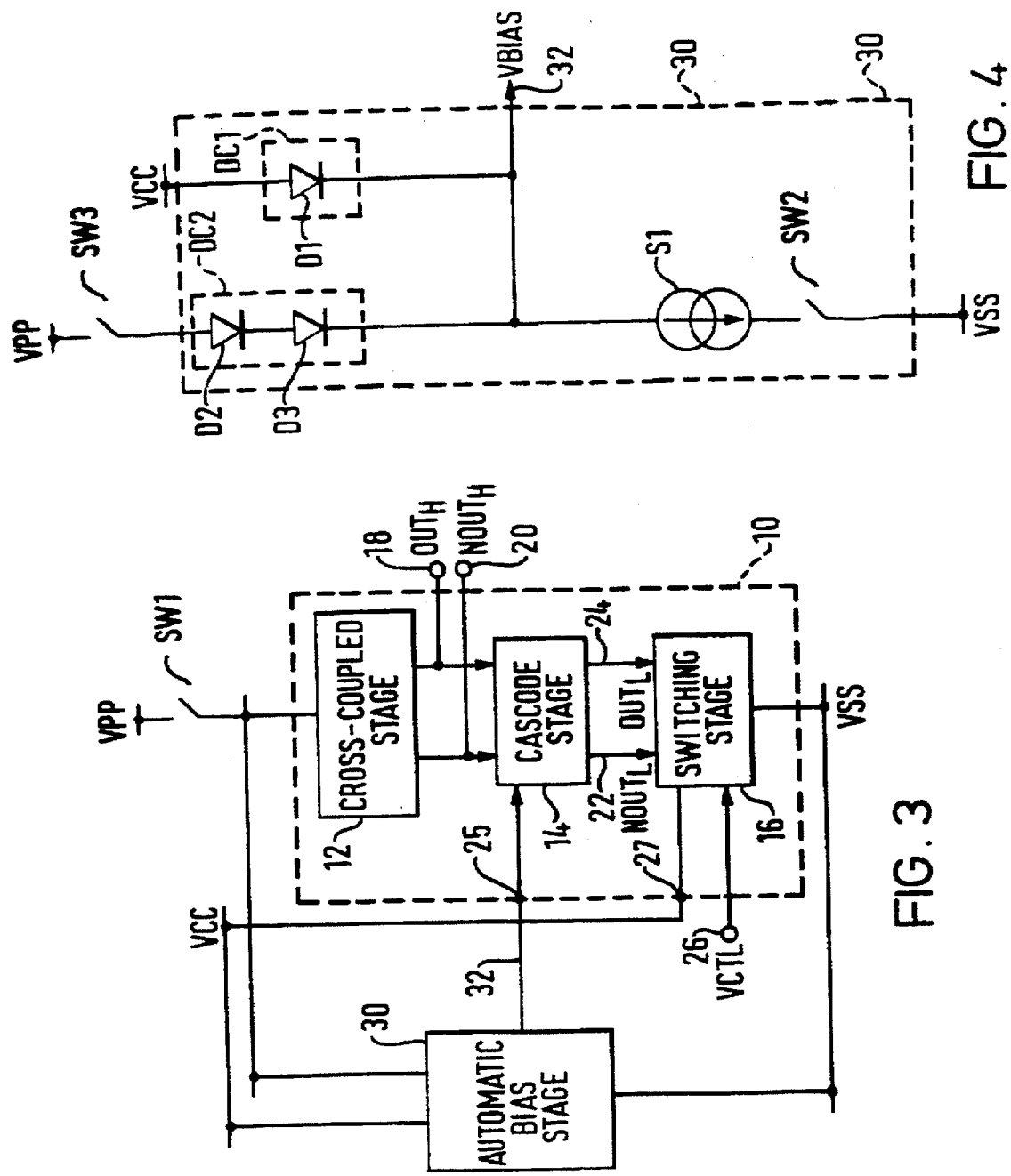
FIG. 3 illustrates a block diagram of an embodiment of an automatic bias stage that is biasing a voltage level converter according to the present invention.
FIG. 4 illustrates a detailed diagram of the automatic bias stage of FIG. 3.

FIG. 3 illustrates a block diagram of an embodiment of a voltage level converter according to the invention.

Figure 1:
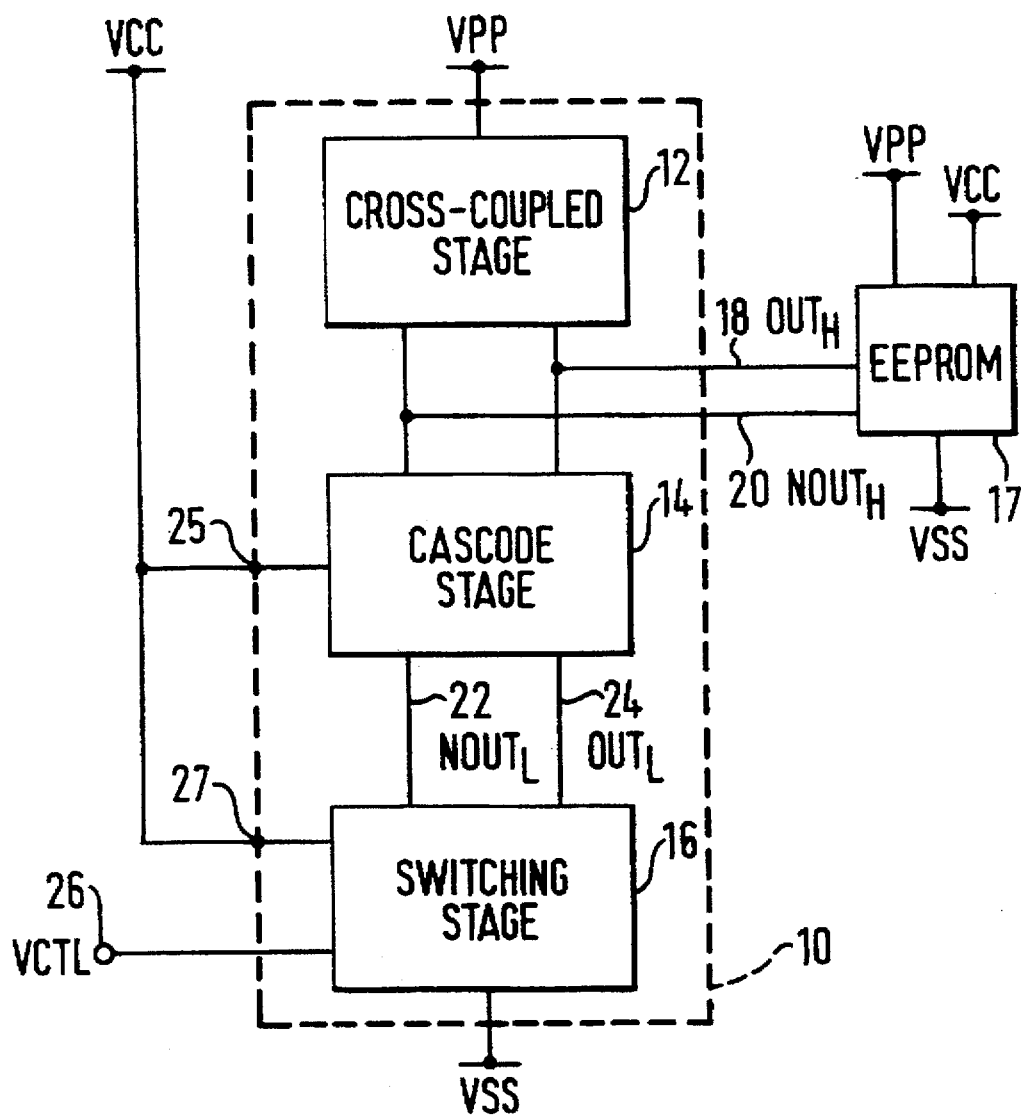
FIG. 1 illustrates a block diagram of a known voltage level converter.
Figure 2:
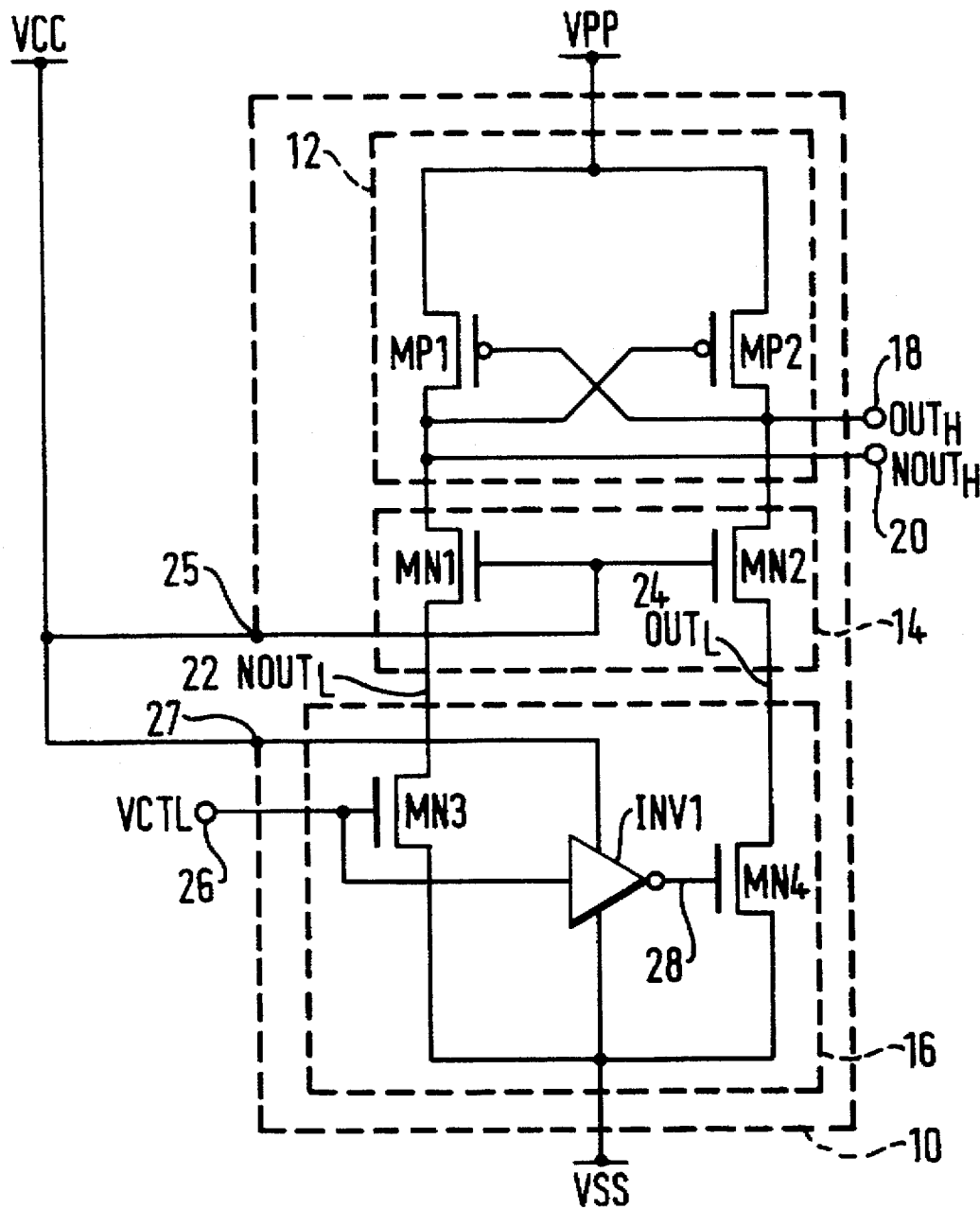
FIG. 2 illustrates a detailed circuit diagram of the voltage level converter of FIG. 1.

Referring to FIG. 3, this again illustrates the voltage level converter 10 of FIGS. 1 and 2, however in this current illustration, terminal 27 is connected to the voltage source VCC, as before, whereas terminal 25 is connected to the output 32 of the automatic bias stage 30; which is connected to the two positive voltage sources VPP and VCC and the reference voltage source VSS. Stage 30 biases, via its output 32, the cascode stage 14 of the voltage level converter 10; as opposed to the cascode stage 14 being biased by the low voltage source VCC as illustrated in FIGS. 1 and 2. As stated previously, the voltage level converter is required to change state only during the presence of the high voltage VPP. Sw1 can therefore be controlled by the write, erase, and verify function cycles to apply voltage VPP to the converter 10, and not apply VPP during a read function cycle.

FIG. 4 illustrates a block diagram of the automatic bias stage of FIG. 3.

Referring to FIG. 4, the automatic bias stage 30 comprises two diode circuits DC1 and DC2 and a current source S1.

Diode circuit DC1 comprises a diode D1 whose anode is connected to the low voltage source VCC and whose cathode is connected to the output 32.

In this particular embodiment, diode circuit DC2 is illustrated as comprising two series connected diodes D2 and D3. Diode D2 has its anode connected to the high voltage source VPP, whilst diode D3 has its anode connected to the cathode of D2 and its cathode connected to the output 32. Of course, diode circuit DC2 can also be implemented using just one diode (not illustrated) or using three or more series connected diodes (not illustrated).

The current source S1 is connected between the output 32 and the reference voltage source VSS.

During the presence of the high voltage supply VPP, the voltage level converter 10 is required to switch and is thus in an 'active' mode. Therefore, when enabled by switches Sw2–Sw3, the diodes within the diode circuit DC2 and the current source S1 automatically conduct current from the high voltage source VPP to the negative voltage source VSS. The number of diodes used within diode circuit DC2 can be altered to set the value of the bias voltage VBIAS, each diode having a forward voltage drop of typically 0.6 V. Thus if VBIAS is to be set at approximately 6 V, where VPP=12 V, then 10 series connected diodes will be required. VBIAS must be such that it is greater than VCC minus the forward voltage drop of diode circuit DC1, i.e. VCC–$V_{F1}$, or in more general terms, the unidirectional current conduction diode circuit DC1 must be reverse biased.

When the value of VBIAS increases above VCC–$V_{F1}$, diode circuit DC1 automatically turns-off and isolates the low voltage source VCC from the bias voltage VBIAS. VBIAS would typically have to have a voltage of approximately VCC+1 V, or more, so as to ensure that diode circuit DC1 is reverse biased. Therefore, diode circuit DC2 can be designed such that when the high voltage source VPP is present, the voltage VBIAS attains a value of approximately VPP/2; where VPP/2>VCC–$V_{F1}$.

During the absence of the high voltage source VPP the voltage level converter 10 is not required to switch and is thus in a 'standby' mode. Therefore, diode circuit DC2 automatically turns-off. When VBIAS decreases below VCC–$V_{F1}$, diode circuit DC1 automatically turns-on: assuming that VCC is always present, regardless of whether VPP is present or not. Diode circuit DC2 isolates the high voltage source VPP from the bias voltage VBIAS. It should be noted that the current source S1 will continue to conduct as long as the bias voltage VBIAS remains greater than its required activation voltage, or in more general terms, the current source S1 must be forward biased.

With a low voltage source VCC of approximately 3 V, it is important that the forward voltage drop of diode D1 is as low as possible, i.e. that its steady-state conduction losses are as low as possible, so that in the absence of VPP the bias voltage VBIAS is as close as possible to the value of VCC. In such a case, the value of VBIAS, i.e. VCC–$V_{F1}$ will be sufficient enough to hold the state of the cascode stage 14, since, the voltage level converter 10 is only required to change state when the high voltage source VPP is present. Furthermore, the circuit of FIG. 4 can be used to bias a plurality of voltage level converters 10 (not illustrated).

Figure 5:
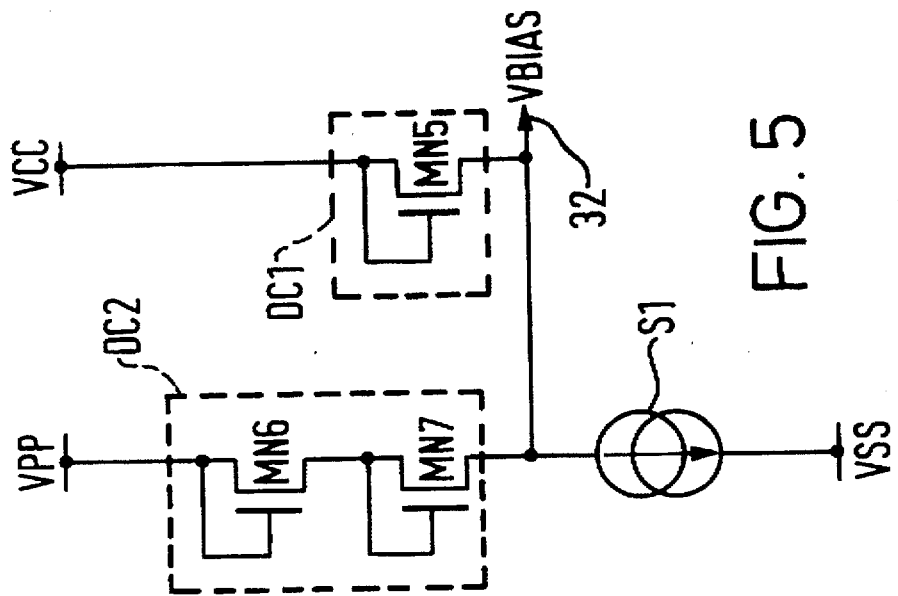
FIG. 5 illustrates a detailed circuit diagram of an alternative embodiment of the bias stage of FIG. 4.

FIG. 5 illustrates an alternative embodiment of that of FIG. 4.

Referring to FIG. 5, the diode circuits DC1 and DC2 are illustrated as being implemented with diode connected NMOS transistors, MN5, MN6 and MN7. Transistors MN6 and/or MN7 can have their respective aspect ratios, i.e. W/L ratios, and/or gate threshold implants adjusted during the design phase so as to set the bias voltage VBIAS to a predetermined value during the presence of VPP. It would be advantageous if transistor MN5 were a 'natural' transistor; as opposed to a gate 'threshold adjusted' transistor, since it would have a lower gate-source switching threshold $V_{TH}$ which would result in a greater bias voltage VBIAS, for a given aspect ratio. Conversely, it would be advantageous if transistor MN6 and/or transistor MN7 were 'threshold adjusted' NMOS transistors; as opposed to 'natural' NMOS transistors, since their combined switching threshold would need to be approximately 1 V greater than the voltage source VCC. Further, it would be advantageous if both transistor MN5 and transistor MN6 and/or transistor MN7 were respectively 'natural' and 'threshold adjusted' transistors.

It should be noted that, any, or all, of the aforementioned diodes can be implemented with a suitably chosen and connected combination of: p-n; zener; MOS or Schottky diodes.

One application for the invention lies within a memory circuit having three supply terminals, and more specifically, within a triple supply EEPROM or FLASH EEPROM memory circuit in which the magnitude of the low voltage source VCC is approximately 3 V or less and the magnitude of the high voltage source VPP is substantially greater than VCC i.e. approximately 12 V. Alternatively, the memory circuit could have two supply terminals and internal circuitry, i.e. a charge pump and/or a potential divider, wherein the second positive voltage is generated or derived from the first.

Figure 6:
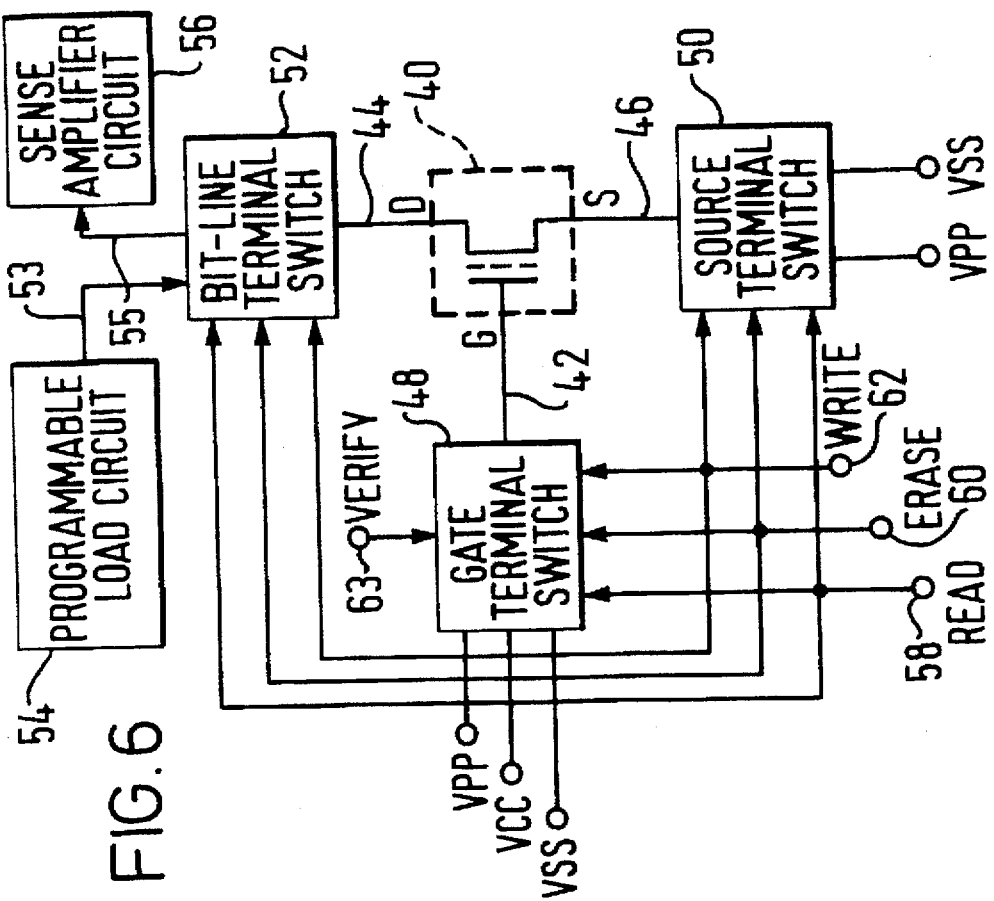
FIG. 6 illustrates a simplified block diagram of a single floating gate MOS transistor memory cell of the type found within an EEPROM or FLASH EEPROM memory circuit.

FIG. 6 illustrates a simplified block diagram of a single floating gate MOS transistor memory cell of the type found within an EEPROM or FLASH EEPROM memory circuit.

Referring to FIG. 6, the memory cell 40 comprises a three terminal floating gate NMOS transistor 40 that has a control gate terminal 42, a drain terminal 44, and a source terminal 46: the substrate terminal (not illustrated) is connected to the negative voltage source VSS. The gate terminal 42 is connected to the output of a gate terminal switch 48, the source terminal 46 is connected to the output of a source terminal switch 50, and the drain terminal 44 is connected to the bit-line terminal switch 52.

The gate terminal switch 48 has connections to all three voltage sources VPP, VCC and VSS, whilst the source terminal switch 50 has connections only to voltage sources VPP and VSS. The bit-line terminal switch 52 has an input connection 53 from a programmable load circuit 54 and an output connection 55 to a sense amplifier 56.

The gate, source and bit-line terminal switches 48, 50 and 52 all have respective connections 58, 60 and 62 to the input control signals READ, ERASE and WRITE. The gate terminal switch 48 also has a connection 63 to the input control signal VERIFY, which is used to verify that the memory cell has been correctly written to or programmed.

A basic application of the invention is one in which the complementary output signals $OUT_H$ and $NOUT_H$ of the voltage level converter 10 of FIG. 3 are used directly to control the terminal switches 48, 50 and 52 during WRITE or ERASE cycles. For example, during a WRITE cycle: sometimes referred to as a PROGRAM cycle; the voltage VPP needs to be present on the gate terminal 42 and in order to achieve this, it is necessary that the WRITE control signal is substantially at a voltage of VPP so as to turn-on the gate terminal switch 48. Likewise, during an ERASE cycle, the voltage VPP needs to be present on the source terminal 46 and in order to achieve this, it is necessary that the ERASE control signal is substantially at a voltage of VPP so as to turn-on the source terminal switch 50.

Figure 7:
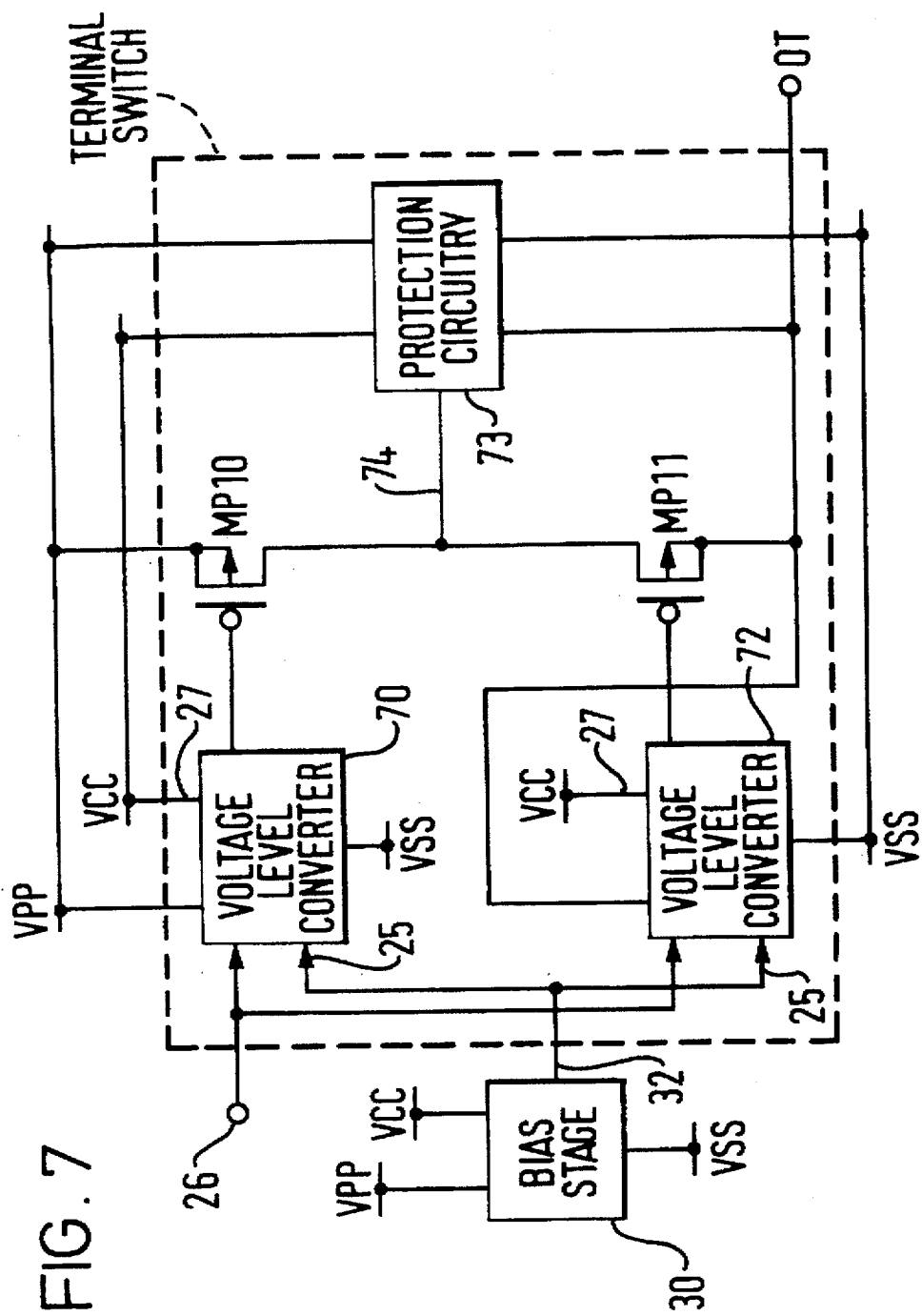
FIG. 7 illustrates a partial block and partial circuit diagram of an embodiment of part of a terminal switch of an EEPROM or FLASH EEPROM memory cell or cells.

FIG. 7 illustrates a partial block and partial circuit diagram of an embodiment of part of a terminal switch of an EEPROM or FLASH EEPROM memory cell or cells.

Referring to FIG. 7, this illustrates a more complex application of the invention. In this particular embodiment, the terminal switch 48, 50 or 52, which is connected to the output terminal 32 of an automatic supply voltage sensing bias stage 30, includes two voltage level converters 70 and 72, two PMOS transistors MP10 and MP11, and conventional protection circuitry 73 for protecting the output terminal OT of the terminal switch. An example of a circuit that may be used as the protection circuitry 73 is disclosed as the bias circuitry 52, 54, 56 in FIG. 5A of European Patent No. 0,499,110, which is assigned to Texas Instruments and is incorporated by reference.

The bias stage 30 biases both of the voltage level converters 70 and 72, which are both controlled in unison by a low voltage level, i.e. VCC level, signal which corresponds to either a READ, ERASE or WRITE control signal.

Both the bias stage 30 and the voltage level converter 70 are supplied directly from the voltages sources VPP, VCC and VSS.

The source and substrate terminals of transistor MP10 are connected to the voltage source VPP, whilst its gate terminal is connected and controlled by one of the high voltage output terminals of the voltage level converter 70. The drain terminals 74 of transistors MP10 and MP11 are connected together, whilst the source and substrate terminals of transistor MP11 constitute the output terminal OT of the terminal switch. The gate terminal of transistor MP11 is connected and controlled by one of the high voltage output terminals of the voltage level converter 72, which corresponds to the same high voltage output terminal of the voltage level converter 70.

Voltage level converter 72 is supplied directly from voltage sources VCC and VSS and indirectly from voltage source VPP via transistors MP10 and MP11, that is to say, the high voltage supply terminal of voltage level converter 72 is connected to the output terminal OT of the terminal switch.

The protection circuitry 73 is connected between all of the voltage sources VPP, VCC and VSS, the output terminal OT, and the drain terminals 74 of transistors MP10 and MP11. The primary purpose of the protection circuitry 73 is to ensure that the potential difference across the drain and source terminals of transistor MP11 is kept to a minimum during and after the turn-on of transistor MP11.

The terminal switch architecture illustrated in FIG. 7 is known to those skilled in the art and thus a description of the operation of this circuit is not necessary. The aspect to be appreciated, with respect to FIG. 7, is the application of the automatic supply voltage sensing bias stage 30 biasing the voltage level converters 70 and 72 during the presence of the voltage source VPP, for the purpose of either a READ, ERASE or WRITE function.

Figure 8:
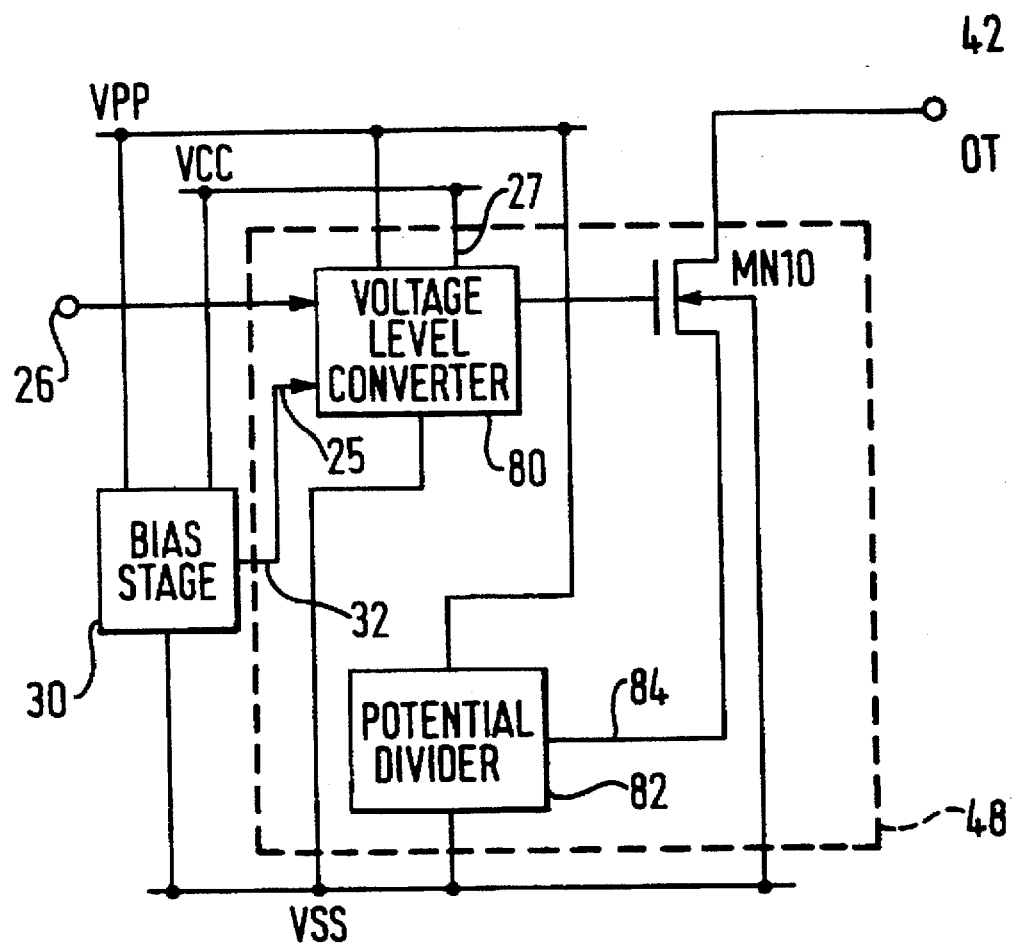
FIG. 8 illustrates a partial block and partial circuit diagram of an embodiment of another part of a terminal switch of an EEPROM or FLASH EEPROM memory cell or cells.

FIG. 8 illustrates a partial block and partial circuit diagram of an embodiment of another part of a terminal switch of an EEPROM or FLASH EEPROM memory cell or cells.

Referring to FIG. 8, in this particular embodiment, the gate terminal switch 48 includes another voltage level converter 80, an NMOS transistor MN10 and a potential divider 82.

The bias stage 30 biases the voltage level converter 80, which is controlled by the low voltage level VERIFY control signal. Both the bias stage 30 and the voltage level converter 80 are supplied directly from the voltages sources VPP, VCC and VSS.

The potential divider 82 is supplied from the voltage sources VPP and VSS and provides, via an output terminal 84, a potential of approximately 7 V, which is derived from VPP.

The NMOS transistor MN10 has its drain terminal connected to the output terminal 42 of the gate terminal switch 48, its gate terminal connected to and controlled by one of the high voltage output terminals of the voltage level converter 80, its source terminal is connected to the output terminal 84 of the potential divider 82, and its substrate terminal is connected to the voltage source VSS.

Again, the terminal switch architecture illustrated in FIG. 8 is known to those skilled in the art and thus a description of the operation of this circuit is not necessary. The aspect to be appreciated, with respect to FIG. 8, is the application of the automatic supply voltage sensing bias stage 30 biasing the voltage level converter 80 during the presence of the voltage source VPP for the purpose of verifying the WRITE cycle.

If a power-down mode is required, a switching element or elements (not illustrated) can readily be incorporated into the automatic supply voltage sensing and bias stage 30 so as to block the dc current path, thus saving on power consumption. The switching element can be placed either at the high-side or the low-side of the current source S1.

Many variations of the automatic bias circuit 30 may be conceived by one skilled in the art without departing from the spirit and scope of the invention. Non-exhaustive examples of variations being the use of combinations of diode connected MOS, p-n junction diodes, zener diodes or Schottky diodes and/or the use of MOS and/or bipolar transistors for implementing the switching element or elements.

I claim:

1. A voltage level converter having:
   an input bias terminal;
   connections to a low voltage source, a high voltage source and a reference voltage source;
   first and second output terminals that carry complementary high voltage output signals; and an input control terminal;
   an output terminal of an automatic bias stage, coupled to said input bias terminal, said bias stage comprising a first unidirectional current conduction means connected between said low voltage source and said output terminal of the bias stage; a second unidirectional current conduction means connected between said high voltage source and said output terminal of the bias stage; and a third current conduction means connected between said output terminal of the bias stage and said reference voltage source, said bias stage providing substantially said low voltage to said output terminal of the bias stage in the absence of said high voltage and providing a bias voltage, that is greater than said low voltage when said high voltage is present, said bias voltage being derived from said high voltage when the high voltage is present.

2. The voltage level converter according to claim 1, characterized in that:
   the first unidirectional current conduction means comprises a first diode;
   the second unidirectional current conduction means comprises a second diode;
   the third current conduction means comprises a current source.

3. The voltage level converter according to claim 2, characterized in that the first or second diode is a diode connected n-channel MOS transistor.

4. The voltage level converter according to claim 2, characterized in that the second unidirectional current conduction means further comprises at least a third diode that is connected in series with the second diode.

5. The voltage level converter according to claim 4, characterized in that at least one of said first, second, or third diode is a diode connected n-channel MOS transistor.

6. The voltage level converter according to claim 3, characterized in that if said first diode is said diode connected n-channel MOS transistor, it is a 'natural' MOS transistor.

7. The voltage level converter according to claim 1, further comprising a controlled switching means for interrupting the flow of current between said output terminal of said bias stage and the reference voltage source.

8. The voltage level converter according to claim 1, characterized in that said voltage level converter further comprises:
   a cross-coupled stage, connected to the high voltage source, for providing the complementary high voltage output signals to the respective first and second output terminals;
   a cascode stage, for buffering between the high voltage source and the reference voltage source, the cascode stage having first and second cascode stage input terminals, first and second cascode stage output terminals, and coupled to the input bias terminal,
   the first and second cascode stage input terminals being respectively connected to the first and second output terminals,
   the input bias terminal being connected to the output terminal of the bias stage; and
   a switching stage, connected to the low voltage source and the reference voltage source, the switching stage having first and second switching stage input terminals and coupled to the input control terminal,
   the first and second switching stage input terminals being respectively connected to the first and second cascode stage output terminals.

9. The voltage level converter according to claim 8, characterized in that:
   the cross-coupled stage comprises first and second, p-channel MOS transistors;
   the cascode stage comprises first and second, n-channel MOS transistors;
   the switching stage comprises third and fourth, n-channel MOS transistors and an inverting stage,
   the inverting stage connected between the low voltage source and the reference voltage source, the inverting stage having an input terminal that is connected to the input control terminal and the gate terminal of the third n-channel MOS transistor, and the inverting stage having an output terminal that is connected to the gate terminal of the fourth n-channel MOS transistor.

10. The voltage level converter according to claim 1, characterized in that it constitutes part of one or more terminal switches in one or more memory cells or blocks of memory cells of a memory device.

11. The voltage level converter according to claim 10, characterized in that the memory device is an EEPROM or a flash EEPROM memory circuit.

12. A method of controlling a voltage level converter that comprises:

an input bias terminal; connections to a low voltage source, a high voltage source and a reference voltage source; first and second output terminals that carry complementary high voltage output signals; and an input control terminal, characterized in that said method comprises the steps of:

automatically biasing an output terminal of a bias stage by means of a low voltage bias when said converter is not required to operate; and automatically biasing the output terminal of said bias stage by means of a high voltage bias when said converter is required to operate, said low voltage biasing being derived from said low voltage source, via a first unidirectional current conduction means that is connected between said low voltage source and said bias stage output terminal, and said high voltage biasing being derived from said high voltage source, via a second unidirectional current conduction means that is connected between said high voltage source and said bias stage output terminal, said bias stage having a third current conduction means connected between said bias stage output terminal and said reference voltage source, wherein said bias stage output terminal is coupled to the input bias terminal.

13. The method according to claim 12 wherein:

the low voltage bias is substantially that of said low voltage source, and the high voltage bias is a selected voltage that is greater than said low voltage bias.

14. A method of controlling a voltage level converter that comprises:

an input bias terminal; connections to a low voltage source, a high voltage source and a reference voltage source, first and second output terminals that carry complementary high voltage output signals; and an input control terminal, characterized in that said method comprises the steps of:

automatically biasing an output terminal of a bias stage by means of a low voltage bias when the voltage from said high voltage source is not present and automatically biasing the output terminal of said bias stage by means of a high voltage bias when the voltage from said high voltage source is present, said low voltage biasing being derived from said low voltage source, via a first unidirectional current conduction means that is connected between said low voltage source and said bias stage output terminal, and said high voltage biasing being derived from said high voltage source, via a second unidirectional current conduction means that is connected between said high voltage source and said bias stage output terminal, said bias stage having a third current conduction means connected between said bias stage output terminal and said reference voltage source, wherein said bias stage output terminal is coupled to the input bias terminal.

15. The method according to claim 14, wherein, the low voltage bias is substantially that of said low voltage source, and the high voltage bias is a selected voltage that is greater than said low voltage bias.

16. A terminal switch including a voltage level converter comprising:

an input bias terminal;

connections to a low voltage source, a high voltage source and a reference voltage source;

first and second output terminals that carry complementary high voltage output signals;

and an input control terminal;

wherein the input bias terminal is connected to an output terminal of an automatic bias stage, said bias stage comprising:

a first unidirectional current conduction means connected between said low voltage source and said output terminal of the bias stage;

a second unidirectional current conduction means connected between said high voltage source and said output terminal of the bias stage;

and a third current conduction means connected between said output terminal of the bias stage and said reference voltage source, said bias stage providing substantially said low voltage to said output terminal of the bias stage in the absence of said high voltage and providing a bias voltage, that is greater than said low voltage, when said high voltage is present, said bias voltage being derived from said high voltage.

17. The terminal switch of claim 16 wherein the first and second unidirectional current means are comprised of at least one diode each.

18. The terminal switch of claim 17 wherein each said diode is an n-channel MOS transistor connected as a diode.

19. A terminal switch comprising:

first and second voltage level converters, each voltage level converter including an input bias terminal, connections to a low voltage source, a high voltage source and a reference voltage source, first and second output terminals that carry complementary high voltage output signals, and an input control terminal, wherein each input bias terminal is connected to an output terminal of an automatic bias stage, said bias stage including:

a first unidirectional current conduction means connected between said low voltage source and said output terminal of the bias stage, a second unidirectional current conduction means connected between said high voltage source and said output terminal of the bias stage, and a third current conduction means connected between said output terminal of the bias stage and said reference voltage source, said bias stage providing substantially said low voltage to said output terminal of the bias stage in the absence of said high voltage and providing a bias voltage, that is greater than said low voltage, when said high voltage is present, said bias voltage being derived from said high voltage, first and second p-channel MOS transistors;

circuitry for protecting an output terminal of the terminal switch;

the first voltage level converter being supplied directly from said low, high and reference voltage sources, the second voltage level converter being supplied directly from the low voltage source and the reference voltage source and indirectly from the high voltage source via the first and second p-channel MOS transistors, the input control terminals of the first and second voltage level converters are connected and controlled in unison;

the input bias terminals of the first and second voltage level converters are connected and controlled in unison by the output of said bias stage;

the first p-channel MOS transistor has its source and substrate terminals connected to the high voltage source and its gate terminal connected to one of the output terminals of the first voltage level converter, the second p-channel MOS transistor has its drain terminal connected to the drain terminal of the first p-channel MOS transistor, its source and substrate terminals connected to the output terminal of the terminal switch and its gate terminal connected to one of the output terminals of the second voltage level converter;

the circuitry for protecting the output terminal of the terminal switch, being coupled to the low, high and reference voltage sources, the drain terminals of the first and second p-channel MOS transistors and the output terminal of the terminal switch.

20. The terminal switch of claim 19 further including:

a third voltage level converter, that is supplied directly from said low, high and reference voltage sources, has an input control terminal and an input bias terminal;

a potential divider that has an output terminal that provides an output voltage, said divider being supplied by the high voltage source and the reference voltage source; and a first n-channel MOS transistor that has its drain terminal connected to the output terminal of the terminal switch, its substrate terminal connected to the reference voltage source, its gate terminal connected to one of the output terminals of the third voltage level converter and its source terminal connected to the output terminal of the potential divider.

21. An EEPROM memory device including one or more terminal switches each including at least one voltage level converter, each voltage level converter comprising:

an input bias terminal;

connections to a low voltage source, a high voltage source and a reference voltage source;

first and second output terminals that carry complementary high voltage output signals;

and an input control terminal;

wherein the input bias terminal is connected to an output terminal of an automatic bias stage, said bias stage comprising:

a first unidirectional current conduction means connected between said low voltage source and said output terminal of the bias stage;

a second unidirectional current conduction means connected between said high voltage source and said output terminal of the bias stage;

and a third current conduction means connected between said output terminal of the bias stage and said reference voltage source, said bias stage providing substantially said low voltage to said output terminal of the bias stage in the absence of said high voltage and providing a bias voltage, that is greater than said low voltage, when said high voltage is present, said bias voltage being derived from said high voltage.

22. The EEPROM memory device of claim 21 wherein the first and second unidirectional current means are comprised of at least one diode each.

23. The EEPROM memory device of claim 22 wherein each said diode is an n-channel MOS transistor connected as a diode.

24. An EEPROM memory device comprising one or more terminal switches, each terminal switch including first and second voltage level converters, each voltage level converter including:

an input bias terminal;

connections to a low voltage source, a high voltage source and a reference voltage source, first and second output terminals that carry complementary high voltage output signals, and an input control terminal, wherein each input bias terminal is connected to an output terminal of an automatic bias stage, said bias stage including:

a first unidirectional current conduction means connected between said low voltage source and said output terminal of the bias stage, a second unidirectional current conduction means connected between said high voltage source and said output terminal of the bias stage, and a third current conduction means connected between said output terminal of the bias stage and said reference voltage source, said bias stage providing substantially said low voltage to said output terminal of the bias stage in the absence of said high voltage and providing a bias voltage, that is greater than said low voltage, when said high voltage is present, said bias voltage being derived from said high voltage, first and second p-channel MOS transistors;

circuitry for protecting an output terminal of each respective terminal switch;

the first voltage level converter being supplied directly from said low, high and reference voltage sources, the second voltage level converter being supplied directly from the low voltage source and the reference voltage source and indirectly from the high voltage source via the first and second p-channel MOS transistors, the input control terminals of the first and second voltage level converters are connected and controlled in unison;

the input bias terminals of the first and second voltage level converters are connected and controlled in unison by the output of said bias stage;

the first p-channel MOS transistor has its source and substrate terminals connected to the high voltage source and its gate terminal connected to one of the output terminals of the first voltage level converter, the second p-channel MOS transistor has its drain terminal connected to the drain terminal of the first p-channel MOS transistor, its source and substrate terminals connected to the output terminal of the respective terminal switch and its gate terminal connected to one of the output terminals of the second voltage level converter;

the circuitry for protecting the output terminal of each respective terminal switch, being coupled to the low, high and reference voltage sources, the drain terminals of the first and second p-channel MOS transistors and the output terminal of each respective terminal switch.

25. A EEPROM memory device of claim 24 further including:
- a third voltage level converter, that is supplied directly from said low, high and reference voltage sources, has an input control terminal and an input bias terminal;
- a potential divider that has an output terminal that provides an output voltage, said divider being supplied by the high voltage source and the reference voltage source; and
- a first n-channel MOS transistor that has its drain terminal connected to the output terminal of the terminal switch, its substrate terminal connected to the reference voltage source, its gate terminal connected to one of the output terminals of the third voltage level converter and its source terminal connected to the output terminal of the potential divider.

* * * * *